United States Patent
Richardson et al.

(10) Patent No.: US 7,231,577 B2
(45) Date of Patent: Jun. 12, 2007

(54) SOFT INFORMATION SCALING FOR ITERATIVE DECODING

(75) Inventors: Tom Richardson, South Orange, NJ (US); Vladimir Novichkov, Towaco, NJ (US); Hui Jin, Annendale, NJ (US)

(73) Assignee: Qualcomm Incorporated, San Diego, CA (US)

( * ) Notice: Subject to any disclaimer, the term of this patent is extended or adjusted under 35 U.S.C. 154(b) by 388 days.

(21) Appl. No.: 10/635,942

(22) Filed: Aug. 7, 2003

(65) Prior Publication Data

US 2004/0168114 A1    Aug. 26, 2004

Related U.S. Application Data

(60) Provisional application No. 60/450,174, filed on Feb. 26, 2003.

(51) Int. Cl.
*H03M 13/00*    (2006.01)

(52) U.S. Cl. .................. 714/758; 714/752; 714/748

(58) Field of Classification Search ............... 714/758, 714/752, 747, 748, 750, 754, 766, 768, 795
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 4,882,733 A * | 11/1989 | Tanner | 714/752 |
| 5,157,671 A | 10/1992 | Karplus | |
| 5,271,042 A | 12/1993 | Borth et al. | |
| 5,293,489 A | 3/1994 | Furui et al. | |
| 5,313,609 A | 5/1994 | Baylor et al. | |
| 5,396,518 A | 3/1995 | How | |
| 5,457,704 A | 10/1995 | Hoeher et al. | |
| 5,526,501 A | 6/1996 | Shams | |
| 5,615,298 A | 3/1997 | Chen | |
| 5,671,221 A | 9/1997 | Yang | |
| 5,860,085 A | 1/1999 | Storman | |

(Continued)

OTHER PUBLICATIONS

PCT International Search Report for International Application No. PCT/US03/24730, Aug. 7, 2003.

(Continued)

*Primary Examiner*—Albert Decady
*Assistant Examiner*—Fritz Alphonse
(74) *Attorney, Agent, or Firm*—Straub & Pokotylo; Michael P. Straub

(57) ABSTRACT

Methods and apparatus for scaling soft values as part of an error correction decoding process are described. Accurate decoding depends on use of the appropriate scale factor. Selection and use of the scale factor to scale soft values is designed to improve and/or optimize decoder performance without the need for prior knowledge of the correct scale factor or the actual channel conditions at the time the signal from which the soft values were obtained was transmitted through a communications channel. The techniques of the present invention assume that the soft values to be processed were transmitted through a communications channel having a quality that can be accurately described by a channel quality value. A scale factor is determined from the distribution of soft values to be scaled and an assumption that the channel through which they were transmitted was of the quality corresponding to a preselected channel quality value.

23 Claims, 5 Drawing Sheets

U.S. PATENT DOCUMENTS

| | | | |
|---|---|---|---|
| 5,864,703 | A | 1/1999 | van Hook et al. |
| 5,867,538 | A | 2/1999 | Liu |
| 5,892,962 | A | 4/1999 | Cloutier |
| 5,933,650 | A | 8/1999 | van Hook et al. |
| 5,968,198 | A | 10/1999 | Hassan |
| 6,002,881 | A | 12/1999 | York et al. |
| 6,073,250 | A | 6/2000 | Luby et al. |
| 6,195,777 | B1 | 2/2001 | Luby et al. |
| 6,247,158 | B1 | 6/2001 | Smallcomb |
| 6,266,758 | B1 | 7/2001 | van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B2 | 11/2002 | Smallcomb |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,754,804 | B1 | 6/2004 | Hudepohl et al. |
| 6,888,927 | B1 * | 5/2005 | Cruickshank et al. .... 379/88.11 |
| 6,954,318 | B2 * | 10/2005 | Sato et al. .................... 360/31 |
| 6,973,143 | B2 * | 12/2005 | Jurgensen et al. .......... 375/340 |
| 6,975,692 | B2 * | 12/2005 | Razzell ....................... 375/341 |
| 2003/0138054 | A1 * | 7/2003 | Ha et al. .................... 375/261 |
| 2004/0034828 | A1 | 2/2004 | Hocevar |

OTHER PUBLICATIONS

Richardson et al. The capacity of low-density parity-check codes under message-passing Decoding, IEEE Transactions on Information Theory; pp. 599-618, Feb. 2001, (same inventor) whole document.

Paranchych et al. Performance of a digital symbol synchronizer in cochannel interference and noise, IEEE Transactions on Communications, pp. 1945-1954; Nov. 2000, whole document.

NN77112415. Digital Encoding of Wide Range Dynamic Analog Signals, IBM Tech. Disclosure Bulletin, Nov. 1, 1997, vol. No. 20; Issue No. 6; pp. 2415-2417, whole document.

NN9210335. Hierarchical Coded Modulation of Data with Fast Decaying Probability Distributions, IBM Tech. Disclosure Bulletin, Oct. 1992, vol. No. 35; Issue No. 5; pp. 335-336, whole document.

Sorokine, V. et al. Innovative coding scheme for spread-spectrum communications, The Ninth IEEE International Symposium on Indoor and Mobile Radio Communications, pp. 1491-1495, vol. 3; Sep. 1998, whole document.

T. Moors and M. Veeraraghavan, "Preliminary specification and explanation of Zing: An end-to-end protocol for transporting bulk data over optical circuits", pp. 1-55 (May 2001).

T. Richardson and R. Urbanke, "The Capacity of Low-Density Parity-Check Codes under Message-Passing Decoding", pp. 1-44 (Mar. 2001).

T. Richarson, A. Shokrollahi, R. Urbanke, "Design of Capacity-Approaching Irregular Low-Density Parity-Check Codes", pp. 1-43 (Mar. 2001).

T. Richardson and R. Urbanke, "An Introduction to the Analysis of Iterative Coding Systems", pp. 1-36.

Saied Hemati, Amir H. Banihashemi, VLSI circuits: Iterative decoding in analog CMOS, Proceedings of the 13th ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213, 261-263, 263, (1986).

* cited by examiner

SOFT INFORMATION SCALING FOR ITERATIVE DECODING

RELATED APPLICATIONS

The present application claims the benefit of U.S. Provisional Patent Application Ser. No. 60/450,174, filed Feb. 26, 2003 titled "SOFT INFORMATION SCALING FOR ITERATIVE DECODING".

FIELD OF THE INVENTION

The present invention relates to decoding and, more particularly, to methods and apparatus for determining a scaling factor which may be used, e.g., to scale soft information values as part of a decoding process.

BACKGROUND OF THE INVENTION

Nearly all forms of electronic communication and storage systems use error-correcting codes. Error correcting codes compensate for the intrinsic unreliability of information transfer in these systems by introducing redundancy into the data stream. The mathematical foundations of error correcting were established by Shannon. Shannon developed the mathematical concept of the channel in which distortion of signals in communications systems is modeled as a random process. The most fundamental result of Shannon is the Noisy channel theorem, which defines for the channel a capacity, a quantity that specifies the maximum rate at which information can be reliably delivered through the channel. This capacity is known as Shannon capacity. Reliable transmission at rates approaching capacity requires the use of error correcting codes. Thus, error-correcting codes are designed to achieve sufficient reliability while approaching capacity as closely as possible. The complexity of implementing the error correcting code is an additional factor that comes into play in practical applications of error correcting codes.

Recent advances in error correcting coding systems resulting from the invention of turbo codes and the subsequent rediscovery and development of low-density parity-check (LDPC) codes offer coding systems of feasible complexity that can approach Shannon's capacity quite closely.

Many kinds of error correcting coding systems rely on soft information. Soft information usually represents a decision on a bit b, i.e., a 1 or a 0, and some measure of the reliability of that decision. For example, a canonical form often used for soft values is the log-likelihood ratio log $$\frac{p(y \mid b = 0)}{p(y \mid b = 1)}$$

where y is some observation of the bit b, e.g., after transmission through a communications channel. Soft input values to a decoder are often obtained from a signal transmitted through a communication channel which may subject the transmitted signal to noise. In such a case, the measure of the reliability of the decision which produced the soft value will reflect the effect of channel noise.

If one uses Binary Phase Shift Key (BPSK) modulation, $x=2b-1$, to transmit a bit through a Gaussian channel, modeled by $y=x+n$ where n denotes a real Gaussian random variable with 0 mean and variance $s^2$, then y is equal to the log-likelihood ratio of x up to a constant factor. More precisely, log $$\frac{p(y \mid x = 1)}{p(y \mid x = -1)} = \frac{2}{s^2} y.$$

For some types of error-correcting systems such as convolutional codes with Viterbi decoding, it is not necessary to know the scale factor $$\frac{2}{s^2}$$

since the decoding is invariant under scaling by positive constants. This is because, in effect, the Viterbi decoder finds the codeword $(x_1, \ldots, x_n)$ that maximizes $x_1 y_1 + x_2 y_2 + \ldots + x_n y_n$ where $y_1, \ldots, y_2$ denote observations corresponding to the transmitted bits $x_1, \ldots, x_n$.

Recently, turbo codes and LDPC codes have been shown to offer significant gains over traditional coding systems such as convolutional codes. The best decoders for these codes, however, do depend on the scaling of the soft values. Inaccurate scaling of soft values can negatively impact decoding performance.

Often in practice it is very difficult to know or estimate the correct scaling factor. This is because unknown scaling of data, that is not easy to track, may occur in the system. Such data scaling which is difficult to track may be performed, e.g., by automatic gain control circuitry or other circuitry. This may be especially true, for example, in fading channels where the channel applies a, possibly unknown or only approximately known, multiplicative gain to x. Using a poor estimate of the correct scaling factor can lead to significant degradation of the coding system's performance. Thus, there is a need for a method that can provide a scale factor for a block of soft data, e.g., a set of soft input values, so that the decoding performance does not suffer a loss, or, minimizes the loss suffered, relative to the case where the correct scaling factor is known. From an implementation standpoint it would be highly desirable if a suitable scale factor could be determined from the soft values to be processed without the need to track scaling and/or various channel conditions that can affect the size of the scale factor which should be applied to soft values prior to decoding.

SUMMARY OF THE INVENTION

The invention is directed to a method and apparatus for scaling soft values prior to, or in conjunction with, error correcting decoding. Selection and use of the scale factor to scale soft values is designed to improve and/or optimize decoder performance without prior knowledge of the correct scale factor or the actual channel conditions at the time the signal, from which the soft values were obtained, was transmitted through a communications channel. The methods and apparatus of the invention are well suited for use in a wide range of devices, e.g., wireless terminals, mobile handsets, and various other types of devices which receive and decode data.

For a given coding scheme and given channel quality, assuming proper scaling by a receiver, a plurality of soft value distributions are possible at the receiver with the distributions varying in a predictable manner depending on channel quality. Thus, for a channel of a particular quality, e.g., as expressed in terms of a channel quality values such as Shannon channel capacity, a set of corresponding soft value distributions can be predicted. Channels having other channel quality values will correspond to different sets of soft value distributions. Thus, in the case of properly scaled soft values, it is possible to relate a particular distribution of soft values at the receiver to a particular channel quality value given a known coding scheme.

In accordance with the invention, it is assumed that the communications channel satisfies a predetermined quality level, e.g., channel capacity, as expressed in terms of a preselected channel quality value. Given this assumption, a scaling factor is determined which, when applied to the input set of soft values, will produce a distribution corresponding to a channel quality matching, e.g., precisely or approximately, the assumed preselected channel quality value.

The determined scaling factor is then used to scale one or more soft input values prior to a decoding operation which is dependent on correct scaling.

In various embodiments the preselected channel quality value is selected, prior to scaling and decoding, to be a value near the point where the channel becomes unacceptable. The preselected value may be within or just outside an acceptable channel quality region. This point where the channel becomes unacceptable may be described as a critical point. The preselected channel quality value may be selected prior to decoding, e.g., based on the coding scheme used, and programmed into the device which will serve as a decoder. The preselected channel quality value may be selected to correspond to a channel capacity which is expected to be achieved given the coding scheme being employed. The preselected channel quality value may remain fixed during extended periods of decoding, e.g., for the life of the communications device or until the device is programmed to support a new coding scheme or the preselected channel quality value is otherwise updated. Thus, the preselected channel quality value is normally independent of the actual channel quality at the time a signal is transmitted through the communications channel and/or received. Furthermore, the preselected channel quality value does not depend on Automatic Gain Control (AGC) functionality or keeping track of other gains applied to a received signal in the communications device which is performing the decoding.

DETAILED DESCRIPTION OF THE INVENTION

Figure 1:
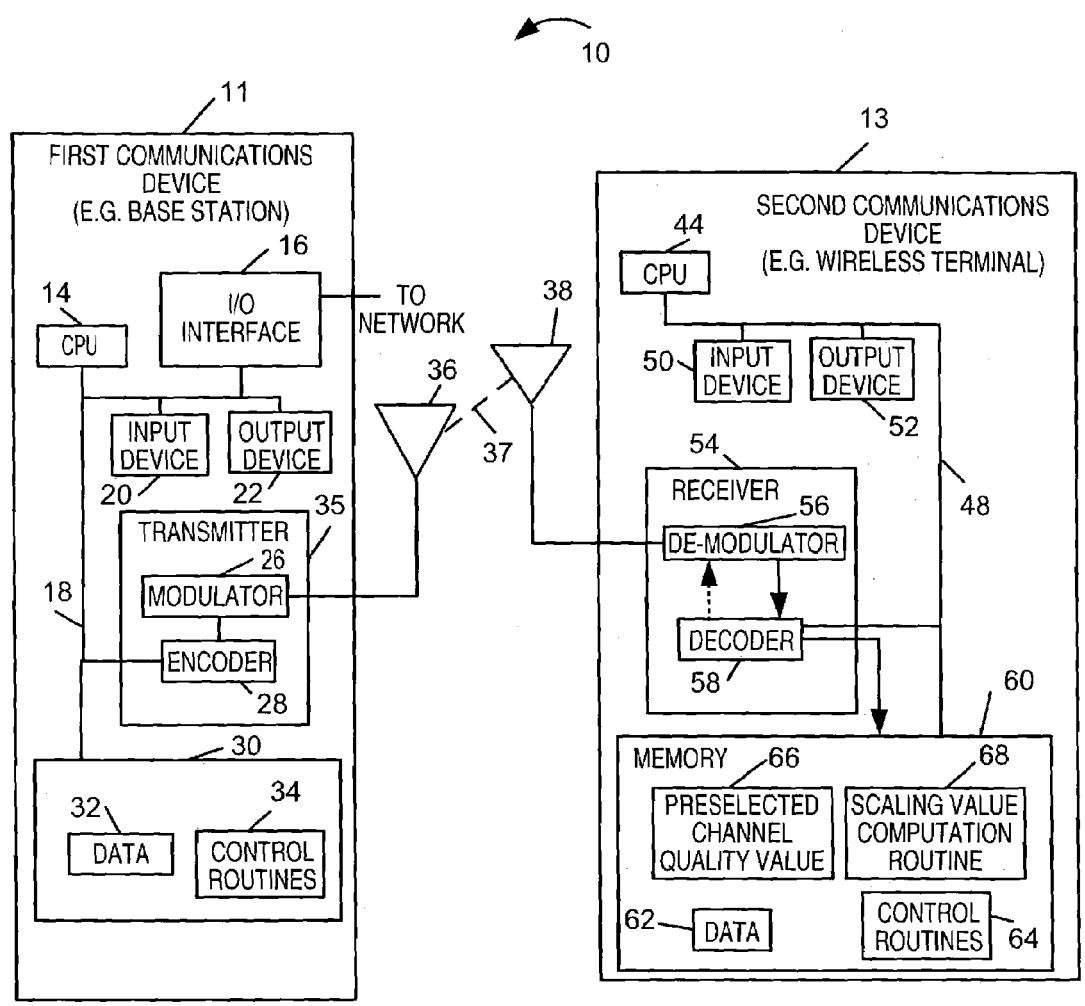
FIG. 1 illustrates an exemplary communications system in which a scaling factor determination method of the present invention can be used in combination with an iterative decoder which depends upon correct scaling of input values.

FIG. 1 illustrates an exemplary communications system 10 in which the scaling factor determination methods of the present invention can be used in combination with an iterative decoder which is dependent on correct soft value scaling, e.g., an LDPC decoder or a Turbo decoder. As illustrated the communications system 10 includes first and second communications devices 11, 13. The first communications device 11 may be, e.g., a base station while the second communications device 13 may be, e.g., a wireless terminal. The base station 11 can communicate with the wireless terminal 13 via an airlink 37.

The first communications device 11 includes a processor 14, e.g. CPU, input/output interface 16, input device 20, output device 22, a transmitter 35, and memory 30 which are coupled together by a bus 18. Memory 30 includes data 32, e.g., data to be transmitted and control routines 34. Processor 14 operating under the direction of control routines 34 controls the transmission of data to the second communications device 13. I/O interface 16 allows the first communications device 11 to receive and/or send data from/to a network such as the Internet. Input device 20 may be, e.g, a keypad, which can be used to input control signals and/or data into the first communications device 11. Output device 22 may include, e.g., a display for displaying information, data and/or device status information to a user. Transmitter 35, which is coupled to a transmitter antenna 36 is used to transmit data over the airlink 37 to the second communications device 13. The transmitter 36 includes an encoder 28 and a modulator 26. The encoder 28 implements any one of a plurality of encoding techniques where decoding of the encoded signal depends on appropriate scaling of soft values obtained from a transmitted signal. The encoder 28 may be, e.g., an LDPC encoder or a Turbo encoder for example. The encoder 28 receives data values to be transmitted and generates encoded values there from. The encoded values output from the encoder 28 are subject to modulation by modulator 26 prior to being transmitted as part of a signal broadcast from antenna 36. While not shown, it should be understood that the first communications device 11 may include receiver circuitry similar to that of the second communications device 13 so that the first communications device 11 can receive as well as transmit data.

The second communications device 13 includes a processor 44, e.g. CPU, input device 50, output device 52, receiver circuitry 54 and memory 60 coupled together via a bus 48. The second communications device 13 also includes a receiver antenna 38 for receiving signals transmitted over the air. Memory 60 is a machine readable media that includes data 62, control routines 64, a preselected channel quality value 66 and a scaling value computation routine 68. Control routines 64 control the general operation of the second communications device 13 when executed by the CPU 44. Data 62 may include data obtained by demodulating and decoding a received signal in accordance with the invention as well as data used by the control routines 64. Scaling value computation routine 68 includes computer instructions and/or modules which, when executed by the CPU 44, cause the processor 44 to generate an appropriate scaling value as a function of unscaled soft values output by the demodulator 56 and the preselected channel quality value 66 stored in memory 60. As an alternative to a software implementation of the invention, hardware modules and/or a combination of hardware and software may be used to compute scaling values in accordance with the invention. While not shown, it should be understood that the second communications device 13 may include transmitter circuitry similar to that of the first communications device 11 so that the second communications device 13 can transmit as well as receive data.

In the FIG. 1 embodiment, soft values output by the demodulator 56 can be supplied through the decoder 58 to the processor 44 for purposes of determining the scale factor to be used as a function of the preselected channel quality value 66. The processor 44 can then scale and return the scaled soft values to the decoder 58. Alternatively, the processor 44 can return the determined scaling factor to be used with scaling circuitry included at the input of the decoder 58 being used to scale the soft input values prior to processing by the circuitry used to implement the scaling dependent iterative decoding process. The decoding process implemented by decoder 58 may be, and often is, the inverse of the encoding process performed by the encoder 28 which was used to perform encoding prior to transmission. The decoder 58 is, in some embodiments, an LDPC decoder.

The airlink 37 between antenna's 36 and 38 represents a communications channel through which the signal generated by transmitter 35 is transmitted. The communications channel may be interpreted as also including other elements in the communications path between the encoder 28 and decoder 58 including, e.g., automatic gain control circuitry, which can affect signal gain and thus the values of the soft values output by demodulator 56. The decoder 58 can, and in some embodiments does, provide feedback, to the demodulator 56. Thus, the demodulator 56 may form part of the iterative decoding process, e.g., loop through which generated soft values are repeatedly processed until a suitable degree of decision reliability is achieved or some other decoding stop criteria are satisfied. The communications channel 37 through which the transmitted signal is communicated introduces noise and will result in scaling errors, e.g., the soft values output by demodulator 56 may be generally too large or too small, e.g., due to channel attenuation, imprecise AGC operation and/or other factors and also may assume a distribution other than the distribution of values which were transmitted.

For a given coding scheme and given channel quality, assuming proper scaling by a receiver, a plurality of soft value distributions are possible at the receiver with the distributions varying in a predictable manner depending on channel quality. Thus, for a channel of a particular quality, e.g., as expressed in terms of channel quality values such as Shannon channel capacity, a set of corresponding soft value distributions can be predicted. Channels having other channel quality values will correspond to different sets of soft value distributions. Thus, in the case of properly scaled soft values, it is possible to relate particular distributions of soft values at the receiver to a particular channel quality value given a known coding scheme.

In accordance with the invention, it is assumed that the communications channel satisfies a predetermined quality level, e.g., channel capacity, as expressed in terms of a preselected channel quality value 66. This value may be selected prior to decoding, e.g., based on the coding scheme used. For example, the preselected channel quality value may be selected to correspond to a channel capacity which is expected to be achieved given the coding scheme being employed. The preselected channel quality value 66 may remain fixed during decoding for extended periods of decoding, e.g., for the life of the communications device 13 or until the device 13 is programmed to support a new coding scheme. Thus, the preselected channel quality value 66 is independent of the actual channel quality at the time a signal is transmitted through the communications channel and/or received. Furthermore, channel quality value 66 does not depend on AGC functionality or keeping track of other gains applied to a received signal in the communications device 13.

Capacity targets, e.g., channel quality values to be used as said preselected channel quality value, can be, and in various embodiments are, selected as follows. Simulate the target code on known, e.g., an Additive White Gaussian Noise (AWGN) channel. Find the capacity of the channel at the point where the performance of the code achieves its target performance level (e.g., $10^{-3}$ frame error rate) and use this for the performance target.

It has been observed that scaling data by too large a factor incurs less degradation then scaling by too small a factor. Therefore, it may be advisable to set the capacity target slightly higher than that dictated by the above method.

It will be clear to experts in the art that functionals other than binary capacity can be used as a basis for scaling. One possible example is the reliability $\tanh(\alpha|y|)$. Targets, e.g., preselected channel quality values are selected and adjusted accordingly, but the basic principle remains the same. Once this is done the method is the same: use a preselected channel quality value near the critical channel parameter for the code being used but within or just outside the range of acceptable channel quality values, assume that the actual channel matches the channel quality value, and compute the scaling factor which would produce a soft value distribution corresponding to the preselected channel quality if applied to the input set of soft values.

As will be discussed below, a scale factor to be used in scaling soft values produced by demodulator 56 is generated under the assumption that the unscaled soft values generated by the demodulator 56 were transmitted through a channel which may be described as satisfying the preselected channel quality value 66. That is, the scaling factor to be used for scaling the demodulator output is determined by computing what scale factor, when applied to the distribution of soft values output by the demodulator, will result in a distribution of soft values corresponding to a communications channel having the level of quality specified by the preselected channel quality value 66.

The computation of the scale factor to be used based on the distribution of soft values output by the demodulator and the preselected channel quality value can be performed using any one of several straightforward techniques. Some techniques involve computing, for a given set of unscaled soft values, multiple channel quality values, each of the multiple channel quality values corresponding to a different potential scaling factor. Interpolation is then used to find a channel quality value between the multiple channel quality values which corresponds to the preselected quality value. The scaling factor corresponding to the interpolated quality value is then determined and selected for use as the scaling factor to be applied to the given set of unscaled soft values.

In accordance with another technique for computing the scaling factor as a function of the soft values output by the demodulator and the preselected channel quality value, a channel quality function is determined from an initial scale factor and at least one of the unscaled soft values output by the demodulator. The initial scale factor may be preselected from a range of scale factors over which the utilized scale factor is allowed to vary. The initial scale factor may be somewhat arbitrary since it merely serves as a starting point from which the scale factor that is applied will be generated. Over time the applied scale factor, referred to as the current scale factor, is adjusted as a function of the soft values output by the demodulator. In accordance with this particular embodiment, the determined quality channel function is solved to determine a scale factor which, when applied to said function given at least one of the soft values generated by the demodulator, produces the preselected channel quality value.

In still other embodiments, a channel quality value corresponding to a soft value scaled by a scale factor, determined in accordance with the present invention, is compared to the preselected channel quality value, and the scaling factor to be applied to a subsequent softvalue is adjusted as a function of any determined difference, e.g., to reduce future discrepancies between the preselected channel quality value and the channel quality value corresponding to a subsequent scaled soft value. In accordance with this approach, adjustments to the scaling value used on the soft inputs is changed over time, e.g., with the scaling value being modified for each soft value being processed. In various embodiments the size of each adjustment in the scaling factor is kept small, e.g. to less than 2% of the maximum step size value and, in some cases less than 0.75% of the maximum step size value to avoid wide swings in the scaling value with each adjustment and to encourage convergence of the scaling factor to a consistent value over time.

While based on certain observations of the nature of typical communications channels and the performance of scaling dependent iterative coding systems such as LDPC codes and turbo codes, the present invention is directed to methods and apparatus for determining and applying a scale factor as part of a decoding process.

The first point of observation upon which the invention is based, is that the performance curves, for many modern iterative coding systems which are scaling dependent, are steep. This means that, compared to, e.g., convolutional codes, the range of channel parameters in which the performance of the coding system changes from, e.g., $10^{-1}$ frame error rate to $10^{-4}$ frame error rate is relatively small. It most cases, the coding system is intended to be used in a certain performance range, i.e., the system has a target performance, e.g., $10^{-3}$ frame error rate for the coding system. This means that the communications system attempts to maintain channel operating conditions close to those that give rise to $10^{-3}$ frame error rate. Thus, let us refer to the range of channel conditions such that the coding system performance is close to the target as the critical region. In this case, sensitivity of performance to estimation of the scale factor is highest when the actual channel conditions are close to the critical region. If the channel is much worse than the critical region, then scaling is often irrelevant since the decoder is very likely to fail anyway. If the channel is much better than the critical value than scaling is not as critical to successful decoding.

The method of the present invention assumes that the channel is near the critical region, e.g., near the edge of the acceptable channel quality region, and derives an appropriate scale factor based on this assumption and the unscaled soft input values. We will show how to do that below. If the channel is near the critical region, but still in an acceptable region, then the assumption is correct or nearly correct, and scaling will be correct or nearly correct and, furthermore, the resulting performance will be the same or nearly the same as if the correct scaling were known and used. If the channel is much worse than the critical region, then scaling is nearly irrelevant, as we already pointed out and decoding may fail but this is likely to occur due to poor channel conditions anyway. If the channel is much better than the critical value than scaling based on the use of a preselected channel quality value near the critical region but still in an acceptable region will still give performance better than the critical value, which in various embodiments is the target performance. In fact, in some implementations it has been observed that such scaling can actually improve performance in the so-called error floor region of an iterative coding system.

We now present a method for performing scaling as described above. Various embodiments of the invention use a value describing, e.g., corresponding, to the critical region that depends primarily or only on the distribution of the magnitudes of properly scaled soft values, e.g., log-likelihood ratios. Then, given a collection of input soft values, e.g., a set of incorrectly scaled log-likelihood ratios, computes a scale factor which, when applied to the unsealed soft values, creates a distribution of log-likelihood ratios that appear to lie in the critical region, e.g., a distribution which corresponds to the preselected channel quality value used to determine the scale factor to be used. The critical region may be expressed in terms of a range of channel quality values with a preselected, e.g., target, channel quality value falling in the critical region which corresponds to acceptable transmission performance but is close to the area where the channel quality becomes unacceptable.

Soft values obtained from a signal transmitted through a channel having a particular quality as indicated by a particular channel quality value will tend to have particular value distributions, e.g., due to a particular amount of channel noise. Accordingly soft value distributions will correspond to channel quality values. A plurality of different soft value distributions normally correspond to a single channel quality value. Different sets of soft value distributions will correspond to different channel quality values. This fact is used in accordance with the present invention, to determine a scaling factor to be used as discussed below.

The various methods of the present invention are based on certain properties of typical channels. These properties include the fact that different soft value distributions can be expected, assuming correct soft value scaling, given channels of different channel qualities and the fact that these different channel qualities can be expressed as a channel quality value, e.g., a Shannon capacity value, which can be used in various computations.

Let $p(|)$ denote a memoryless symmetric binary channel. Symmetry, in this context, means $p(y|x=1)=p(-y|x=-1)$. Let f denote the density of the magnitudes of received log-likelihood ratios associated to this channel. Then, the binary Shannon capacity, e.g., maximum rate under BPSK signalling, of the channel is given by $$\int_0^\infty (1 - h(z(x))) f(x) dx$$

where $$z(x) = \frac{1}{1 + e^x}$$

and h is the binary entropy function defined as $h(z)=-z \log_2 z - (1-z) \log_2(1-z)$. Suppose we have an empirical sample, e.g., the magnitudes of unsealed soft input values, $|y_1|, \ldots, |y_n|$ where $y_i$ is equal to $\alpha^{-1}$ times the long-likelihood ratio associated to bit i in, e.g., a transmitted LDPC codeword. If a is known then we can estimate the corresponding channel quality value, e.g., capacity of the channel, as $$\frac{1}{n}\sum_{i=1}^{n}(1-h(z(\alpha|y_i|))).$$

Similarly, if the channel capacity C were known we could solve for α using $$C \approx \frac{1}{n}\sum_{i=1}^{n}(1-h(z(\alpha|y_i|))).$$

The basic idea is that if the preselected channel quality value C is chosen appropriately, e.g., set to some target capacity $C^t$, one can solve the above equation to find α, and thereby determine the scaling factor. The determined scaling factor can then be used to scale the soft input values to produce the scaled sequence $\alpha y_1 \ldots \alpha y_n$ which is then provided as the scaled soft input to an iterative decoder. When this is done in accordance with one of the various embodiments of the invention, then performance of the decoder will be nearly the same as when the correct a were actually known. Furthermore, this technique can be used regardless of the type of memoryless channel, e.g., regardless of the distribution of the magnitudes of the log-likelihood ratios. This is because it has been observed that if the critical region is described in terms of a channel quality value, e.g., the Shannon capacity of the channel, rather than typical parameters, such as $s^2$ for the AWGN channel or the cross-over probability for the binary symmetric channel, then the observed critical region does not depend significantly on the particular channel and can, in most cases, be nearly uniquely described by a channel quality value, e.g., the Shannon channel capacity. Thus, a good choice for $C^t$ is nearly invariant to the particular details of the channel and depends primarily on the particular code employed, provided the code is designed well and has a steep performance curve. This invariance is particularly useful in situations where the channel is complicated and can change quickly in time, e.g., in the case of wireless fading channels.

The methods of the present invention will now be described with references to FIGS. 2–4.

Figure 2:
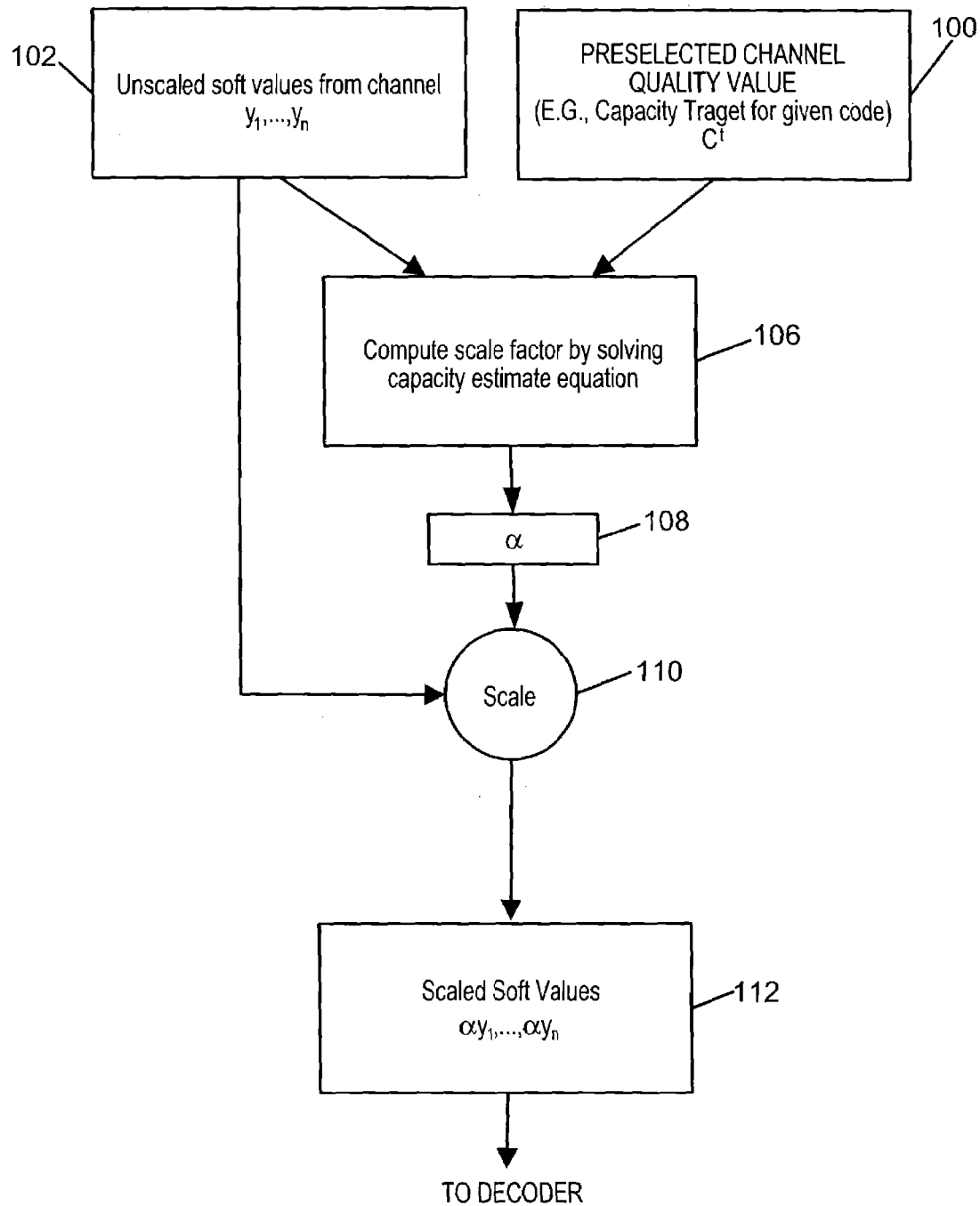
FIG. 2 illustrates a method of the present invention where a scaling factor is generated for a given set of input values as a function of a preselected channel quality value.

FIG. 2 illustrates an implementation where a scaling factor is generated for a given set of input values 102 as a function of a preselected channel quality value 100, e.g., a channel capacity target value $C^t$.

In step 106, the input unscaled soft values $y_1, \ldots, y_n$ 102, e.g., the output of a demodulator 56, and the capacity target $C^t$ 100 are used compute a scale factor to be applied by solving a capacity estimation equation for α 108. The capacity estimation equation which is solve may be expressed as follows:

$$C^t = \frac{1}{n}\sum_{i=1}^{n}(1-h(z(\alpha|y_i|)))$$

where $C^t$ is the preselect channel quality value, e.g., channel target capacity, i is a count varable indicating the number of the unscaled soft symbol in the input set of n soft symbols and h is the known soft value distribution function corresponding to the corresponding coding function used.

Next, in step 110, α 108 is used to scale the unscaled soft values $y_1, \ldots, y_n$ 102 to obtain scaled soft values $\alpha y_1, \ldots, \alpha y_n$ 112. The scaled soft values $\alpha y_1, \ldots, \alpha y_n$ 112, assuming appropriate scaling, will be, in one embodiment, log-likelihood ratios which can be reliably decoded by the iterative decoder 58.

In addition to the general scaling method, we propose two practical methods for input data scale adaptation based on channel capacity matching to a predefined target $C^t$. First, we define the function g by $g(x)=1-h(z(x))$.

Figure 3:
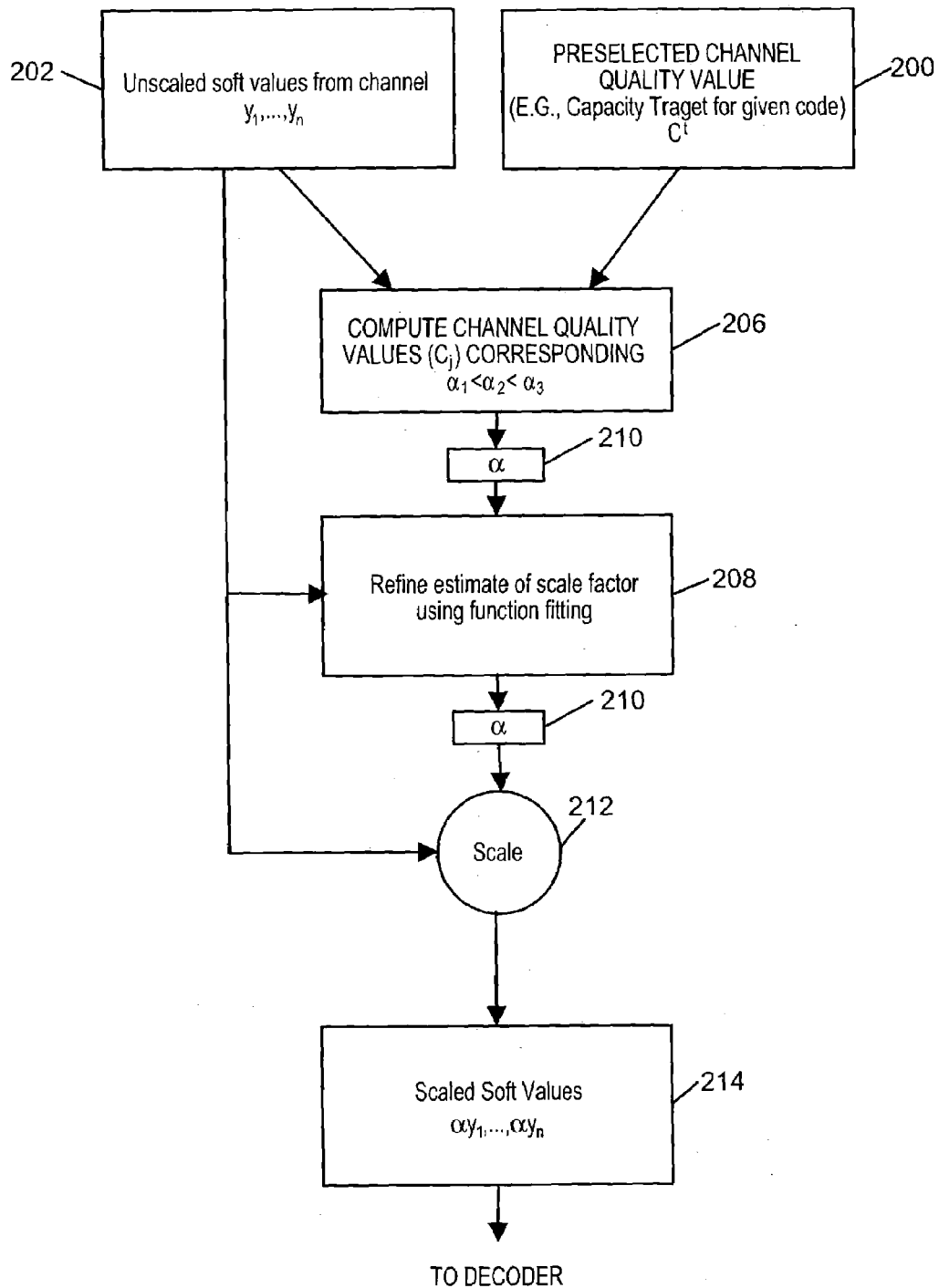
FIG. 3 illustrates an exemplary scale factor determination method of the present invention, which determines a scale factor to be applied to soft values in accordance with one embodiment of the present invention.

FIG. 3 illustrates a scale factor determination method of the invention which determines the scale factor to be applied in a single pass over the input unscaled soft values $y_i \ldots y_n$. 202 as a fucnton of the preselected channel quality value 200, e.g., capacity target $C^t$ for the code which is being used. In step 206, magnitudes of the unscaled soft values 202 $|y_1|, \ldots, |y_n|$ and the capacity target $C^t$ 200, is used to compute a plurality of channel quality values, e.g., capacities $C_j$ for 3 or more different scale factors $\alpha_1 < \alpha_2 < \alpha_3$ (chosen to cover at least a portion of an expected range of actual value of α) as follows:

$$C_j = \frac{1}{n}\sum_{i=1}^{n}g(\alpha_j|y_i|))$$

Then, in step 208, the estimate for scale factor is refined by using a fitting function, e.g., as a function of the unscaled soft values 202. For example, a 2nd or higher order inverse interpolation is performed to estimate the scale factor matching the target capacity $C^t$. An alternative and more accurate method which may, and sometime is used to implement step 208, is to tabulate coefficients of polynomials that fit the function $g(\alpha x)$ as a function of α around each possible argument and then average them over the samples. Inverse interpolation may be done in hardware as a successive approximation iteration using elementary addition/subtraction/shift operation. The capacity function g( ) or the coefficients of the fitting polynomial can, and in some embodiments are, stored in a lookup table included in memory 60. It is possible to perform this capacity computation on the fly during system data transfer operations. A refined estimate of scale factor α 210 is obtained as output from step 208. Next, in step 212 α 210 is used to scale the unscaled input soft values $y_1, \ldots, y_n$ 202 to obtain scaled soft values $\alpha y_1, \ldots, \alpha y_n$ 214. The scaled soft values $\alpha y_1, \ldots, \alpha y_n$ 214, assuming appropriate scaling, which will be in the form of log-likelihood ratios in some embodiments, can be accurately processed by the decoder 58.

Figure 4:
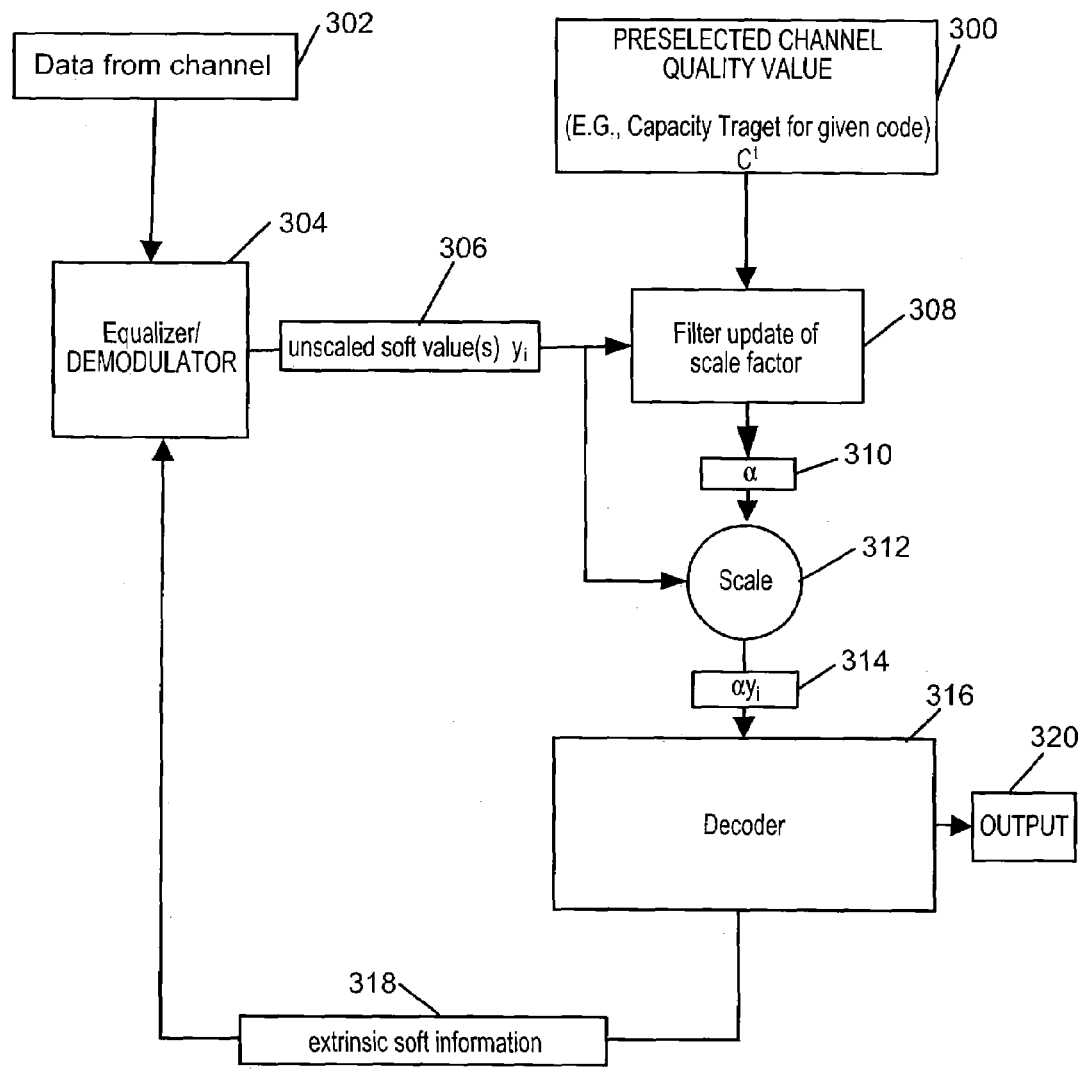
FIG. 4 illustrates another method for determining and using a scaling factor, in accordance with another exemplary embodiment of the invention.

FIG. 4 illustrates another method of determining and using a scaling factor in accordance with the invention. The method of FIG. 4 is well suited for use in a system where soft values $y_i$ are processed continuously, e.g., in a turbo equalization scheme. In this case the scale factor α can be determined using a control loop. The error signal in the control loop is determined by the difference between the preselected channel quality value, e.g., channel target capacity, and a channel quality value corresponding to a scaled sample, e.g., sample channel capacity $g(\alpha|y_i|)$ The error signal is then filtered and applied as a correction to the current scale factor to form an iterative update process. In this may be done as follows:

$\alpha_{i+1}=\alpha_i+\epsilon*\alpha_i*(C^t-g(\alpha_i*y_i))$, where $\epsilon$ is a step-size parameter. Sim can be used with, e.g., different update step sizes. $\alpha$ can be allowed to vary between some preselected minimum and maximum value. The scale factor adjustment step size is selected in various embodiments to be relatively small, e.g., less than 2% of the maximum value of $\alpha$ and, in many cases less than 1% of the maximum size of $\alpha$.

This method has an additional advantage in turbo equalization schemes as it can maintain nearly constant input capacity throughout the decoding process compensating for positive scale feedback coming from increasing decoder extrinsic soft output.

In FIG. 4, data from the channel 302 is subjected to equalizer and/or demodulator processing in step 304 resulting in an output of an unscaled soft value $y_i$ 306. The unscaled soft value $y_i$ 306 and a preselected channel quality value, e.g., Capacity Target for a given code $C^t$ 300, are input to a filtering step 308 which is used to update the scale factor $\alpha$ 310. The filtering step may be performed by a filter implemented in hardware. The filter used in step 308 is a non-linear filter that solves for the scale factor $\alpha$ 310 as a function of the soft values input thereto and the preselected channel quality value 300. The filtering performed in step 308 is performed on a per-value basis with gradual adjustments being made for each sample processed. The scale factor $\alpha$ may be initially set to a predetermined starting value, e.g., 1, and converges as filtering proceeds. As part of the filtering process, the filter used in step 308 measures capacity contribution and compares it to $C^t$ 300. If capacity contribution is larger than $C^t$, the scale factor $\alpha$ 310 will be reduced. If capacity contribution is smaller than $C^t$, the scale factor $\alpha$ is increased. Next, element 312 multiples or scales the value of scale factor $\alpha$ 310 output from filtering step 308 by the unscaled soft value $y_i$ 306 resulting in a scaled soft value $\alpha$ $y_i$ 314. Scaled soft value $\alpha$ $y_i$ 314 is input into a decoder 316 which outputs extrinsic soft information 318. The extrinsic soft information 318 enters the equalizer 304 where it is processed into a new unscaled soft value $y_i$ 306. The new unscaled soft value $y_i$ 306 enters filtering step 308, where the filtering processing previously described occurs, in order to slowly drive the value of scale factor $\alpha$ 310 to the correct value. Processing proceeds again through the scaling step 312, decoding 316, and equalizer step 304. The looping continues until a satisfactory scale factor value $\alpha$ 310 is obtained. Then the scaled value of $\alpha$ $y_i$ is used as a log-likelihood ratio by the decoder 316 to generate output 320.

Figure 5:
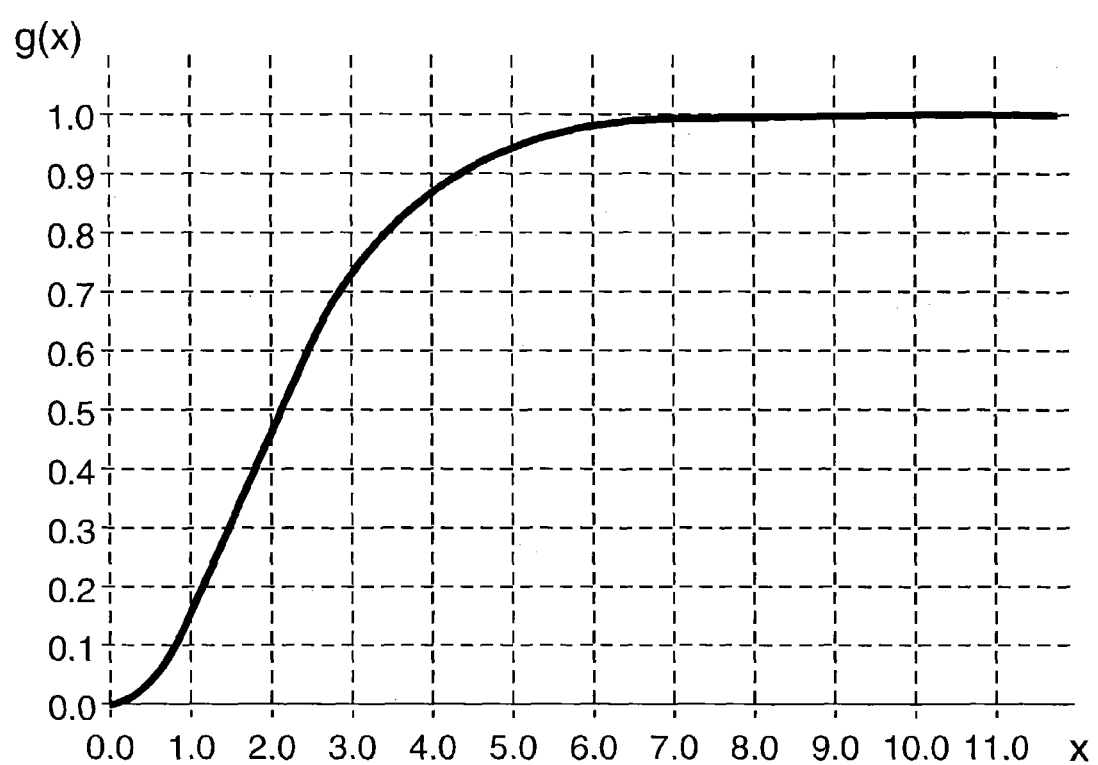
FIG. 5 illustrates the function g, where $g(x)=1-h(z(x))$ with h being the binary entropy function and $z(x)=1/(1+e^x)$, corresponding to the use of Shannon channel capacity as the channel quality value.

In FIG. 5 we present the graph of the function g, where $g(x)=1-h(z(x))$ with h being the binary entropy function, $h(x)=(1-x)\log_2(1-x)-x\log_2(x)$, and $z(x)=1/(1+e^x)$, corresponding to the use of Shannon channel capacity as the channel quality value. If x is a random variable distributed as the magnitude of log-likelihood ratios associated to a particular channel, then the expected value of g(x) is the (binary input) Shannon capacity for that channel.

The above described methods may be implemented in a computer system that includes memory, a CPU and one or more input and/or output devices coupled together. The memory includes a routine implemented in accordance with the invention. When executed, the routine causes the CPU to receive, process, and output data in accordance with the present invention. Alternatively, the steps of the present invention may be implemented using dedicated hardware, e.g., circuits and/or a combination of hardware and software.

The above described methods and apparatus are well suited for use with a variety of decoding techniques which are dependent on scaling. Examples of such techniques include LDPC decoding and turbo decoding techniques.

What is claimed:

1. A method of operating an apparatus to scale soft input values obtained, from a signal transmitted through a communications channel, as part of a decoding process, the method comprising:
   computing a current scaling factor as a function of a preselected channel quality value and at least one of said soft values, said preselected channel quality value being independent of actual channel conditions at the time said signal was transmitted; and
   scaling one of said soft values using said computed current scaling factor to produce a scaled soft value.

2. The method of claim 1, wherein a plurality of soft value distributions are possible, a subset of possible soft value distributions corresponding to said preselected channel quality value while other possible distributions correspond to other channel quality values, said step of computing a current scaling factor including:
   determining a scaling factor which, when applied to said received soft values, produces a soft value distribution in said subset of soft value distributions corresponding to said preselected channel quality value.

3. The method of claim 2, wherein determining a scaling factor includes:
   computing from at least some of said soft input values a plurality of channel quality values, each channel quality value corresponding to a different scale factor.

4. The method of claim 3, further comprising:
   interpolating between at least two of said plurality of channel quality values to produce an interpolated value; and
   determining said current scale factor as a function of the interpolated quality value.

5. The method of claim 2, wherein determining the current scale factor is part of a iterative process that includes:
   updating the current scale factor as a function of a soft value scaled by the current scale factor being updated.

6. The method of claim 5, wherein said updating includes:
   comparing a channel quality value corresponding to the scaled soft value to the target quality value to determine a difference between the target quality value and the corresponding quality value; and
   adjusting the scaling factor as a function of said determined difference.

7. The method of claim 6, wherein said scale factor is adjusted in a direction which reduces subsequent differences between the channel quality value corresponding to a subsequently processed soft value and said target channel quality value.

8. The method of claim 6, wherein scale factor adjustments are made within a range extending between a maximum permitted scaling value and a minimum permitted scaling value, individual scale factor adjustments being no larger than a maximum adjustment step size of 2% of the maximum permitted scaling value.

9. The method of claim 3, wherein computing said scaling factor includes;
   determining a current channel quality function from a first scale factor.

10. The method of claim 9, further comprising:
    solving said function to determine a scale factor which, when applied to said function given said at least some soft input values, produces said target channel quality, said determined scale factor being used as said current scale factor.

11. The method of claim 1, wherein said preselected channel quality value is a channel capacity value.

12. The method of claim 1, wherein said preselected channel quality value is a value corresponding to a quality region that is within but near the edge of an acceptable channel quality region.

13. The method of claim 1, wherein said decoding process includes at least one of a low density parity check decoding operation and a turbo code decoding operation.

14. An apparatus for determining a factor to be used to scale soft input values obtained, from a signal transmitted through a communications channel, comprising:
   a receiver for receiving a signal transmitted through a communications channel;
   means for generating soft input values from said received signal;
   memory for storing a preselected channel quality value, said preselected channel quality value being independent of actual channel conditions at the time said signal was transmitted; and
   means for computing a scaling factor as a function of said preselected channel quality value and at least one of soft input values.

15. The apparatus of claim 14, wherein said preselected channel quality value is a value corresponding to a quality region that is near the edge of an acceptable channel quality region.

16. The apparatus of claim 15, wherein said preselected channel quality value is a channel capacity value.

17. The apparatus of claim 14, wherein a plurality of soft value distributions are possible, a subset of possible soft value distributions corresponding to said preselected channel quality value while other possible distributions correspond to other channel quality values, said means for computing a scaling factor including:
   means for determining a scaling factor which, when applied to said received soft values, produces a soft value distribution in said subset of soft value distributions corresponding to said preselected channel quality value.

18. The apparatus of claim 17, wherein said means for determining a scaling factor includes:
   means for computing from at least some of said soft input values a plurality of channel quality values, each channel quality value corresponding to a different scale factor.

19. The apparatus of claim 18, further comprising:
   means for interpolating between at least two of said plurality of channel quality values to produce an interpolated value; and
   means for determining said scale factor as a function of the interpolated quality value.

20. The apparatus of claim 19, wherein said means for computing and means for interpolating each include computer instructions for controlling a processor to implement at least a portion of said computing and interpolating operations.

21. The apparatus of claim 17, wherein said means for determining the current scale factor performs an interactive process, said apparatus further including:
   a control loop for updating the current scale factor as a function of a soft value scaled by the current scale factor being updated.

22. The apparatus of claim 21, wherein said control loop includes:
   a comparator for comparing a channel quality value corresponding to the scaled soft value to the target quality value to determine a difference between the target quality value and the corresponding quality value; and
   means for adjusting the scaling factor as a function of said determined difference.

23. The apparatus of claim 18, wherein said means for computing said scaling factor includes:
   means for determining a channel quality function from a first scale factor; and
   means for solving said function to determine a scale factor which, when applied to said function given said at least some soft input values, produces said target channel quality, said determined scale factor being used as said current scale factor.

* * * * *